(12) United States Patent
Scheuerlein et al.

(10) Patent No.: US 7,887,999 B2
(45) Date of Patent: Feb. 15, 2011

(54) METHOD OF MAKING A PILLAR PATTERN USING TRIPLE OR QUADRUPLE EXPOSURE

(75) Inventors: Roy E. Scheuerlein, Cupertino, CA (US); Christopher J. Petti, Mountain View, CA (US)

(73) Assignee: SanDisk 3D LLC, Milpitas, CA (US)

( * ) Notice: Subject to any disclaimer, the term of this patent is extended or adjusted under 35 U.S.C. 154(b) by 627 days.

(21) Appl. No.: 12/005,276

(22) Filed: Dec. 27, 2007

(65) Prior Publication Data

US 2009/0170030 A1    Jul. 2, 2009

(51) Int. Cl.
G03F 7/22 (2006.01)
H01L 21/02 (2006.01)

(52) U.S. Cl. .................. 430/394; 430/311; 430/313; 430/952

(58) Field of Classification Search ............. None
See application file for complete search history.

(56) References Cited

U.S. PATENT DOCUMENTS

| | | | |
|---|---|---|---|
| 4,151,602 A | 4/1979 | Haisma et al. | |
| 4,646,266 A | 2/1987 | Ovshinsky et al. | |
| 5,595,843 A * | 1/1997 | Dao .......................... | 430/5 |
| 5,751,012 A | 5/1998 | Wolstenholme et al. | |
| 5,835,396 A | 11/1998 | Zhang | |
| 5,915,167 A | 6/1999 | Leedy | |
| 6,034,882 A | 3/2000 | Johnson et al. | |
| 6,042,998 A | 3/2000 | Brueck et al. | |
| 6,055,180 A | 4/2000 | Gudesen et al. | |
| 6,185,122 B1 | 2/2001 | Johnson et al. | |
| 6,420,215 B1 | 7/2002 | Knall et al. | |
| 6,496,401 B2 | 12/2002 | Weis | |
| 6,618,295 B2 | 9/2003 | Scheuerlein | |
| 6,627,392 B2 | 9/2003 | Pforr et al. | |
| 6,631,085 B2 | 10/2003 | Kleveland et al. | |
| 6,856,572 B2 | 2/2005 | Scheuerlein et al. | |
| 6,879,505 B2 | 4/2005 | Scheuerlein | |
| 6,951,780 B1 | 10/2005 | Herner | |
| 7,009,275 B2 | 3/2006 | Herner et al. | |
| 7,081,377 B2 | 7/2006 | Cleeves | |
| 7,177,169 B2 | 2/2007 | Scheuerlein | |
| 7,307,013 B2 | 12/2007 | Raghuram et al. | |
| 7,642,572 B2 | 1/2010 | Popp et al. | |
| 2002/0058148 A1 | 5/2002 | Den et al. | |
| 2003/0157436 A1 | 8/2003 | Manger et al. | |
| 2005/0052915 A1 | 3/2005 | Herner et al. | |
| 2005/0105371 A1 | 5/2005 | Johnson et al. | |
| 2005/0269553 A1 | 12/2005 | Sen et al. | |
| 2007/0114508 A1 | 5/2007 | Herner et al. | |
| 2007/0228434 A1 | 10/2007 | Shimojo | |
| 2007/0284656 A1 | 12/2007 | Radigan et al. | |
| 2009/0149026 A1 | 6/2009 | Zhou et al. | |

FOREIGN PATENT DOCUMENTS

| | | |
|---|---|---|
| EP | 1 400 979 A | 3/2004 |
| WO | WO 01/11430 A1 | 2/2001 |
| WO | WO 2004/061851 A | 7/2004 |

OTHER PUBLICATIONS

Black et al., Polymer Self Assembly in Semiconductor Microelectronics, IBM J. Res. & Dev., Sep. 2007, pp. 605-633, vol. 51, No. 5.
U.S. Appl. No. 09/560,626, filed Apr. 22, 2000, Knall.
U.S. Appl. No. 11/864,205, filed Sep. 28, 2007, T. Chen et al.
U.S. Appl. No. 09/638,428, filed Aug. 14, 2000, Johnson.
Naji, Peter J. et al., "A 256kb 3.0V 1T1MTJ Nonvolatile Magnetoresitive RAM", Digest of of Technical Papers of the 2001 IEEE International Solid-State Circuits Conference, ISSCC 2001 / Session 7 / Technology Directions: Advanced Technologies / 7.6, Feb. 6, 2001, 3 pgs.
U.S. Appl. No. 12/005,346, filed Dec. 27, 2007, Roy Scheuerlein et al.
International Search Report and Written Opinion mailed Oct. 9, 2009 received in PCT/US2009/048581.
Notice of Allowance mailed Apr. 12, 2010 received in U.S. Appl. No. 12/005,346.

* cited by examiner

*Primary Examiner*—Daborah Chacko Davis
(74) *Attorney, Agent, or Firm*—The Marbury Law Group PLLC

(57) ABSTRACT

Methods of making pillar shaped device array using a triple or quadruple exposure technique are described. A plurality of pillar shaped devices are formed arranged in a hexagonal or rectangular pattern.

14 Claims, 7 Drawing Sheets

METHOD OF MAKING A PILLAR PATTERN USING TRIPLE OR QUADRUPLE EXPOSURE

BACKGROUND

The present invention relates generally to the field of semiconductors and more specifically to the field of memory devices.

As half-pitches approach process nodes that are unsustainable by conventional lithography systems, techniques such as double exposure or double patterning have been used to extend the capabilities of conventional lithography equipment to shorter half-pitches. Double exposure, as its name implies, consists of exposing a single coating of resist twice, using two different masks. Features that are close together are exposed separately in order to counter the undesirable overexposure which is a consequence of non-contact lithography methods.

Conventional memory array layout is rectangular. The memory cells of a memory array are laid out as a rectangular (Cartesian) grid. The standard rectangular layout is used because it is the logical way to structure an array and because conventional semiconductor processes are designed for a rectangular layout.

However, the half-pitch of a rectangular layout cannot be effectively reduced with double exposure techniques. For example, if the bit and word lines can be reduced by a factor of 2 using double exposure, the spacing of the layout of the memory cells can only be reduced by a factor of 1.4 using double exposure.

SUMMARY

One embodiment of the invention relates to a method of making a device using a triple exposure technique. A photoresist layer is formed over a substrate layer. A first exposure of the photoresist layer is performed using a first mask to form first exposed regions in the photoresist layer. A second exposure of the photoresist layer is performed using a second mask to form second exposed regions in the photoresist layer. A third exposure of the photoresist layer is performed using a third mask to form third exposed regions in the photoresist layer. Each adjacent first, second and third exposed regions are approximately equidistant from each other in the photoresist layer after the first, the second and the third exposures. Substrate layer is etched using the patterned photoresist layer. A plurality of pillar shaped devices are formed arranged in a substantially hexagonal pattern.

Another embodiment of the invention relates to a method of making a device using a quadruple exposure technique. At least one semiconductor layer is formed over first conductor lines. A first photoresist layer is formed over the at least one semiconductor layer. A first exposure of the first photoresist layer is performed using a first mask to form first exposed regions in the first photoresist layer. A second exposure of the first photoresist layer is performed using a second mask to form second exposed regions in the first photoresist layer. A third exposure of the first photoresist layer is performed using a third mask to form third exposed regions in the first photoresist layer. A fourth exposure of the first photoresist layer is performed using a fourth mask to form fourth exposed regions in the first photoresist layer. The first photoresist layer is patterned after the first, the second, the third and the fourth exposures. The at least one semiconductor layer is etched to form a plurality of pillar shaped devices. A plurality of second conductor lines is formed over the plurality of pillar shaped devices.

DETAILED DESCRIPTION

Forming Subarray using Triple Exposure

A fabrication method of a single memory level using triple exposure according to a first embodiment of the invention will be described in detail. While the method is preferably used to form the nonvolatile memory array described in the third embodiment below, the method may be used to form any other volatile or nonvolatile memory array, as well as other devices, such as logic, display, photovoltaic, lighting, magnetic data storage, etc. devices. Furthermore, the array of the third embodiment may be formed using methods other than triple exposure, such as by conventional single exposure photolithography. Additional memory levels can be stacked, each monolithically formed above the one below it. In this embodiment, a polycrystalline semiconductor diode will serve as the memory cell. Alternatively, the memory cell can be antifuse, fuse, diode and antifuse arranged in a series, polysilicon memory effect cell, metal oxide memory, switchable complex metal oxide, carbon nanotube memory, phase change material memory, conductive bridge element, or switchable polymer memory.

The formation of the memory device begins with a substrate. This substrate can be any semiconducting substrate as known in the art, such as monocrystallinea silicon, IV-IV compounds including silicon-germanium or silicon-germanium-carbon, III-V compounds, II-VII compounds, epitaxial layers over such substrates, or any other semiconductor material or non-semiconductor material, such as metal, glass, ceramic, plastic, etc. The substrate may include integrated circuits fabricated therein or thereon.

An insulating layer is formed over substrate. The insulating layer can be silicon oxide, silicon nitride, high-dielectric film, Si—C—O—H film, or any other suitable insulating material.

Next, the word lines are formed over the substrate and the insulating layer. An adhesion layer may be included between the insulating layer and the word line layer to help the word line layer adhere to insulating layer. If the overlying word line layer is tungsten, titanium nitride is preferred as adhesion layer. If desired, bit lines rather than word lines may be formed first.

The next layer to be deposited is a word line layer. The word line layer can comprise any conducting material known in the art, such as tungsten, or other materials, including tantalum, titanium, copper, cobalt, or alloys thereof.

Figure 7:
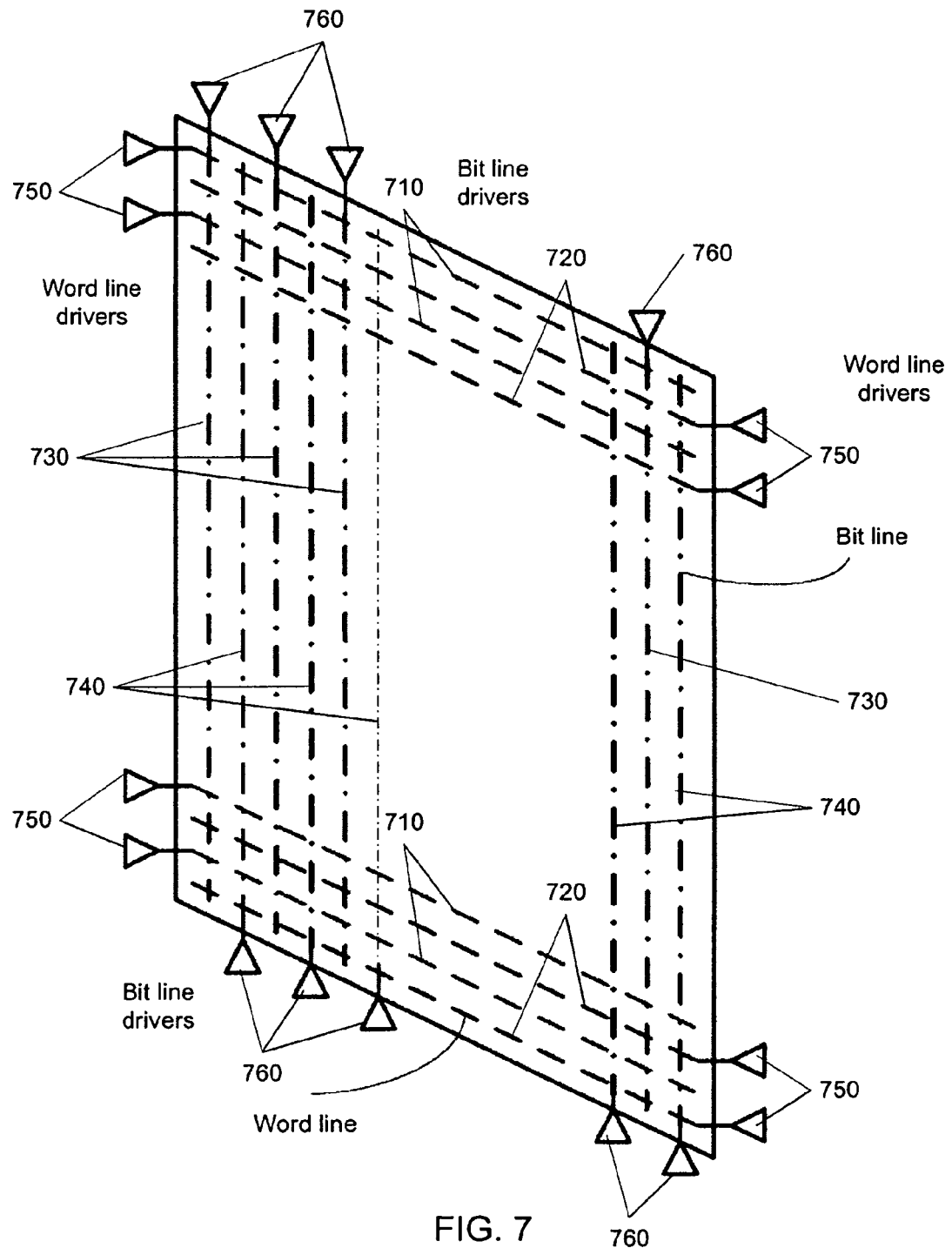
FIG. 7 is a diagram showing a double exposure process of bit lines and word lines in accordance with an exemplary embodiment.

Referring to FIG. 7, a diagram showing a double exposure process of bit lines and word lines in accordance with an exemplary embodiment is shown. Once all the layers that will form the word lines have been deposited, the layers are patterned. Preferably, the word lines are patterned using double exposure and etched using any suitable masking and etching process. However, a single exposure patterning process, or double patterning process, or complementary patterning process may also be used instead. A photoresist layer is deposited on the word line layer. A positive or negative photoresist layer may be used. Preferably, a negative resist is used in which the imaged areas are rendered insoluble. The photoresist layer is exposed using a first mask to form first exposed regions which will be used to etch a first set of word lines 710 which will be driven by word line drivers 750. If a negative photoresist is used, then the exposed regions are rendered insoluble. Then, the photoresist layer is exposed again using a second mask to form second exposed regions which will be used to etch a second set of word lines 720 which are adjacent to the first set of word lines 710. Other features may also be patterned along with the word lines. After the photoresist is developed and patterned, the layers are etched using the patterned photoresist as a mask. The photoresist is then removed using standard process techniques. The word lines could be formed by a Damascene method instead.

Next a dielectric material is deposited over and between word lines. Dielectric material can be any known electrically insulating material, such as silicon oxide, silicon nitride, or silicon oxynitride. In a preferred embodiment, silicon dioxide is used as dielectric material.

Finally, excess dielectric material on top of the word lines is removed, exposing the tops of the word lines separated by dielectric material, and leaving a substantially planar surface. This removal of dielectric overfill to form planar surface can be performed by any process known in the art, such as chemical mechanical polishing (CMP) or etchback. An etchback technique that may advantageously be used is described in Raghuram et al., U.S. application Ser. No. 10/883,417, "Non-selective Unpatterned Etchback to Expose Buried Patterned Features," filed Jun. 30, 2004, which issued as U.S. Pat. No. 7,307,013, and hereby incorporated by reference. At this stage, a plurality of substantially parallel word lines have been formed above the substrate.

Next, vertical pillars will be formed above completed word lines. Preferably a barrier layer is deposited as the first layer after planarization of the word lines. Any suitable material can be used in the barrier layer, including tungsten nitride, tantalum nitride, titanium nitride, or combinations of these materials. In a preferred embodiment, titanium nitride is used as the barrier layer. Where the barrier layer is titanium nitride, it can be deposited in the same manner as the adhesion layer described earlier.

Next, a thin film layer (or layers) of semiconductor material that will be patterned into pillars is deposited. The semiconductor material can be silicon, germanium, a silicon-germanium alloy, or other suitable semiconductors, or semiconductor alloys. For simplicity, this description will refer to the semiconductor material as silicon, but it will be understood that the skilled practitioner may select any of these other suitable materials instead.

In an exemplary embodiment, the pillar comprises a semiconductor junction diode. The term junction diode is used herein to refer to a semiconductor device with the property of non-ohmic conduction, having two terminal electrodes, and made of semiconducting material which is p-type at one electrode and n-type at the other. Examples include p-n diodes and n-p diodes, which have p-type semiconductor material and n-type semiconductor material in contact, such as Zener diodes, and p-i-n diodes, in which intrinsic (undoped) semiconductor material is interposed between p-type semiconductor material and n-type semiconductor material.

First, a bottom heavily doped region can be formed by any deposition and doping method known in the art. The silicon can be deposited and then doped, but is preferably doped in situ by flowing a donor gas providing n-type dopant atoms, for example phosphorus, during deposition of the silicon. The heavily doped region is preferably between about 100 and about 800 angstroms thick.

Next, an intrinsic layer can be formed by any method known in the art. The intrinsic layer can be silicon, germanium, or any alloy of silicon or germanium and has a thickness between about 1100 and about 3300 angstroms, preferably about 2000 angstroms.

The intrinsic layer and heavily doped region just deposited, along with the underlying barrier layer, will be patterned and etched to form pillars. Pillars should have about the same pitch and about the same width as the word lines below, such that each pillar is formed on top of a word line. Some misalignment can be tolerated. P-type diode regions can be formed at this time or after the patterning step as described in more detail below.

Figure 6:
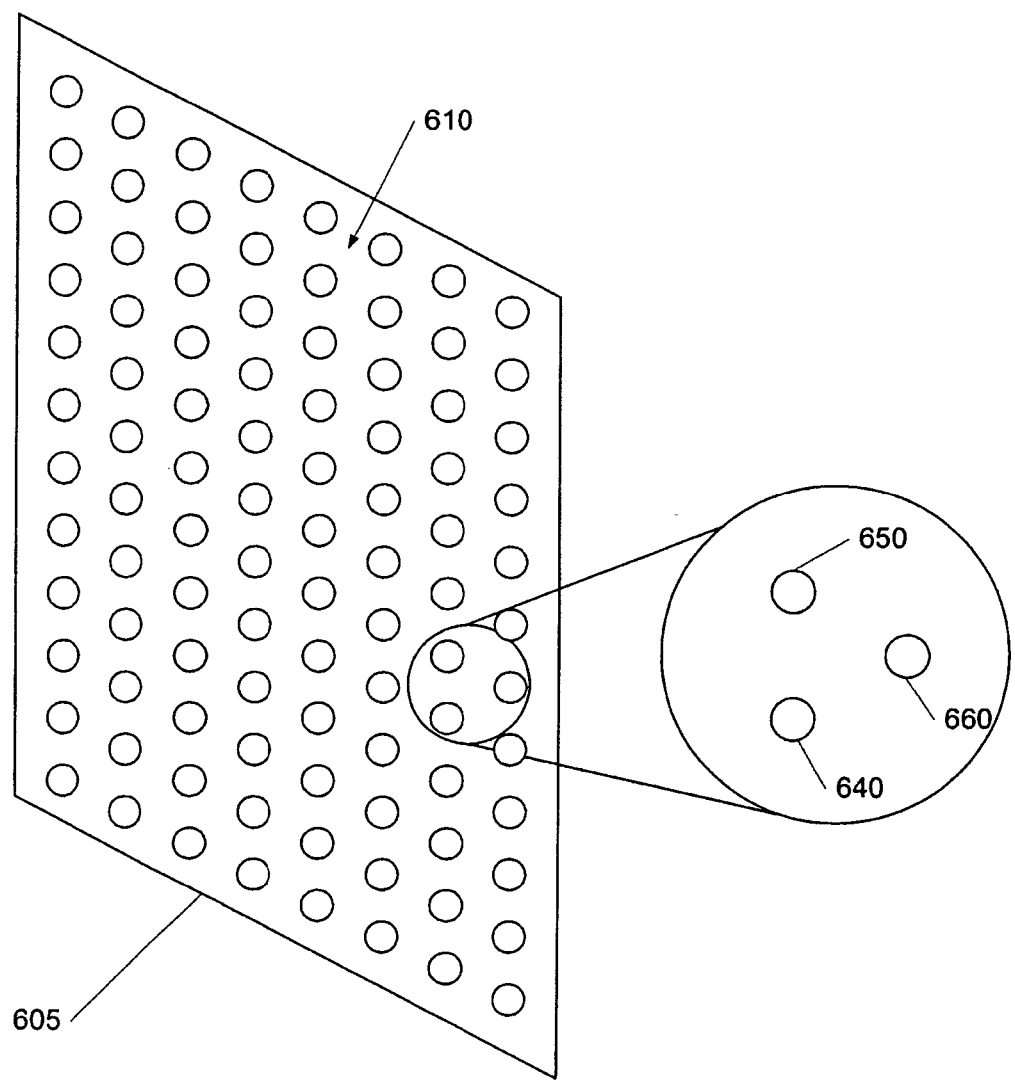
FIG. 6 is a diagram showing a triple exposure process of a memory cell array in accordance with an exemplary embodiment.

The pillars can be formed using any suitable masking and etching process. Referring now to FIG. 6, a diagram showing a triple exposure process of a memory cell array in accordance with an exemplary embodiment is shown. First, a second photoresist layer is formed over the surface of the pillar material, such as the semiconductor layer(s). The photoresist can be a negative photoresist or a positive photoresist. An exemplary process using negative photoresist is now described with reference to FIG. 6. In a subarray area 605, a first exposure of the photoresist layer is performed using a first mask to form first exposed regions 640 in the photoresist layer. Next, a second exposure of the photoresist layer is performed using a second mask to form second exposed regions 650 in the photoresist layer. Finally, a third exposure of the photoresist layer is performed using a third mask to form third exposed regions 660 in the photoresist layer, such that each adjacent first 640, second 650 and third exposed regions 660 are approximately equidistant from each other. The first, second, and third exposure have created a hexagonal pattern 610 in the photoresist which can now be used to form a plurality of pillar shaped devices arranged in a substantially hexagonal pattern. The hexagonal pattern 610 comprises a repeating pattern of seven pillars having a central pillar surrounded by six other pillars arranged in a hexagonal layout around the central pillar. After the photoresist is developed, the pillar layer is etched using the patterned photoresist as a mask. The pillars are preferably cylindrical, but may have other shapes as described herein.

Alternatively, a hard mask of some other material, for example silicon dioxide, silicon nitride, tungsten or tungsten oxide, can be formed on top of the semiconductor layer stack, with bottom antireflective coating (BARC) on top, then patterned and etched. Similarly, a dielectric antireflective coating (DARC) can be used as a hard mask. The semiconductor layers are patterned using the hard mask as a mask before or after the removal of the photoresist layer.

Alternatively a positive photoresist can be used to pattern the pillars. First, second and third exposures of the photoresist expose the positive photoresist in locations for representative pillars 640, 650, 660 in an hexagonal pattern. The photoresist is then developed and forms holes in the locations for representative pillars 640, 650, 660 in a hexagonal pattern. Any suitable image reversal process is then used to create etch resistant shapes in the holes. For example, a hard mask material or a filler material is formed over the photoresist layer and in the holes in the photoresist layer. The hardmask material or the filler material is then planarized such that it remains only in the holes in the photoresist layer. For example, the hardmask layer may be planarized by CMP or etchback, while the filler material may be formed by spin coating a filler material slurry over the photoresist such that it settles only in the holes in the photoresist layer. If the hardmask material, such as an insulating hardmask material (for example silicon oxide, tungsten oxide or silicon nitride) or a conductive hardmask material (for example tungsten), is used to fill the holes in the photoresist, then the hardmask shapes are used as a mask to pattern (i.e., etch) the underlying semiconductor layers. As in the preceding exemplary process, the semiconductor layers are patterned using the hardmask as a mask before or after the removal of the patterned photoresist layer. If a filler material, such as an organic filler material, such as a silicon containing spin-on coating described in U.S. application Ser. No. 11/864,205 to T. Chen et al., filed on Sep. 28, 2007 and incorporated herein by reference in its entirety is used, then a hardmask layer can be located between the filler material and the underlying semiconductor layers. The filler material shapes are used as a mask to pattern the hardmask layer into shapes. The hardmask shapes are then used to as a mask to pattern the underlying semiconductor layers.

After the semiconductor layers are patterned, a dielectric material is deposited over and between the semiconductor pillars, filling the gaps between them. The dielectric material can be any known electrically insulating material, such as silicon oxide, silicon nitride, or silicon oxynitride. In a preferred embodiment, silicon dioxide is used as the insulating material.

Next the dielectric material on top of the pillars is removed, exposing the tops of pillars separated by dielectric material, and leaving a substantially planar surface. This removal of dielectric overfill can be performed by any process known in the art, such as chemical mechanical polishing (CMP) or etchback. After CMP or etchback, ion implantation is performed, forming heavily doped p-type top region of the diode. The p-type dopant is preferably boron or $BCl_3$. This implant step completes formation of the diodes. In the diodes just formed, the bottom heavily doped regions are n-type while the top heavily doped regions are p-type.

Finally, the bit lines are formed in the same manner as the word lines, for example by depositing an adhesion layer, preferably of titanium nitride, and a bit line layer, preferably of tungsten. Referring again to FIG. 7, the bit line layer and adhesion layer are then patterned using double exposure and etched using any suitable masking and etching process. However, a single exposure method may be used instead. In one embodiment, a third photoresist layer is deposited on the bit line layer. The photoresist layer is exposed using a first mask to form first exposed regions which will be used to etch a first set of bit lines 730 which will be driven by bit line drivers 760. If a negative photoresist is used, then the exposed regions are rendered insoluble. Then, the photoresist layer is exposed again using a second mask to form second exposed regions which will be used to etch a second set of bit lines 740 which are adjacent to the first set of bit lines 730. Other features may also be patterned along with the bit lines. After the photoresist is developed, the conductive layers are etched using the photoresist pattern as a mask, and then the photoresist pattern removed using standard process techniques. As noted above, the order of formation of the bit lines and the word lines can be reversed.

Next a dielectric material is deposited over and between the bit lines. The dielectric material can be any known electrically insulating material, such as silicon oxide, silicon nitride, or silicon oxynitride. In a preferred embodiment, silicon oxide is used as this dielectric material. The bit lines cross the word lines at an angle of about 60 degrees. Advantageously, triple exposure allows devices with smaller half-pitches to be formed which allows full use of the reduced scaling factor of double exposed lines. Moreover, the hexagonally packed memory cells require less die area. Additionally, devices with smaller half-pitches use smaller die sizes. The use of triple exposure to form an array of cells in a hexagonal configuration allows the array pattern to be relaxed by a factor of 1.73 compared to a rectangular array configuration formed by conventional single exposure type photolithography.

Formation of a first memory level has been described. Additional memory levels can be formed above this first memory level to form a monolithic three dimensional memory array. In some embodiments, conductors can be shared between memory levels; i.e. the top array lines for one level would serve as the bottom array lines of the next memory level. In other embodiments, an interlevel dielectric is formed above the first memory level, its surface planarized, and construction of a second memory level begins on this planarized interlevel dielectric, with no shared conductors.

A monolithic three dimensional memory array is one in which multiple memory levels are formed above a single substrate, such as a wafer, with no intervening substrates. The layers forming one memory level are deposited or grown directly over the layers of an existing level or levels. In contrast, stacked memories have been constructed by forming memory levels on separate substrates and adhering the memory levels atop each other, as in Leiedy, U.S. Pat. No. 5,915,167, "Three dimensional structure memory." The substrates may be thinned or removed from the memory levels before bonding, but as the memory levels are initially formed over separate substrates, such memories are not true monolithic three dimensional memory arrays.

A monolithic three dimensional memory array formed above a substrate comprises at least a first memory level formed at a first height above the substrate and a second memory level formed at a second height different from the first height. Three, four, eight, or indeed any number of memory levels can be formed above the substrate in such a multilevel array.

An alternative method for forming a similar array in which conductors are formed using Damascene construction is described in Radigan et al., U.S. patent application Ser. No. 11/444,936, "Conductive Hard Mask to Protect Patterned Features During Trench Etch," filed May 31, 2006, assigned to the assignee of the present invention and hereby incorporated by reference. The methods of Radigan et al. may be used instead to form an array according to the present invention.

Forming a Subarray Using Quadruple Exposure

Figure 8:
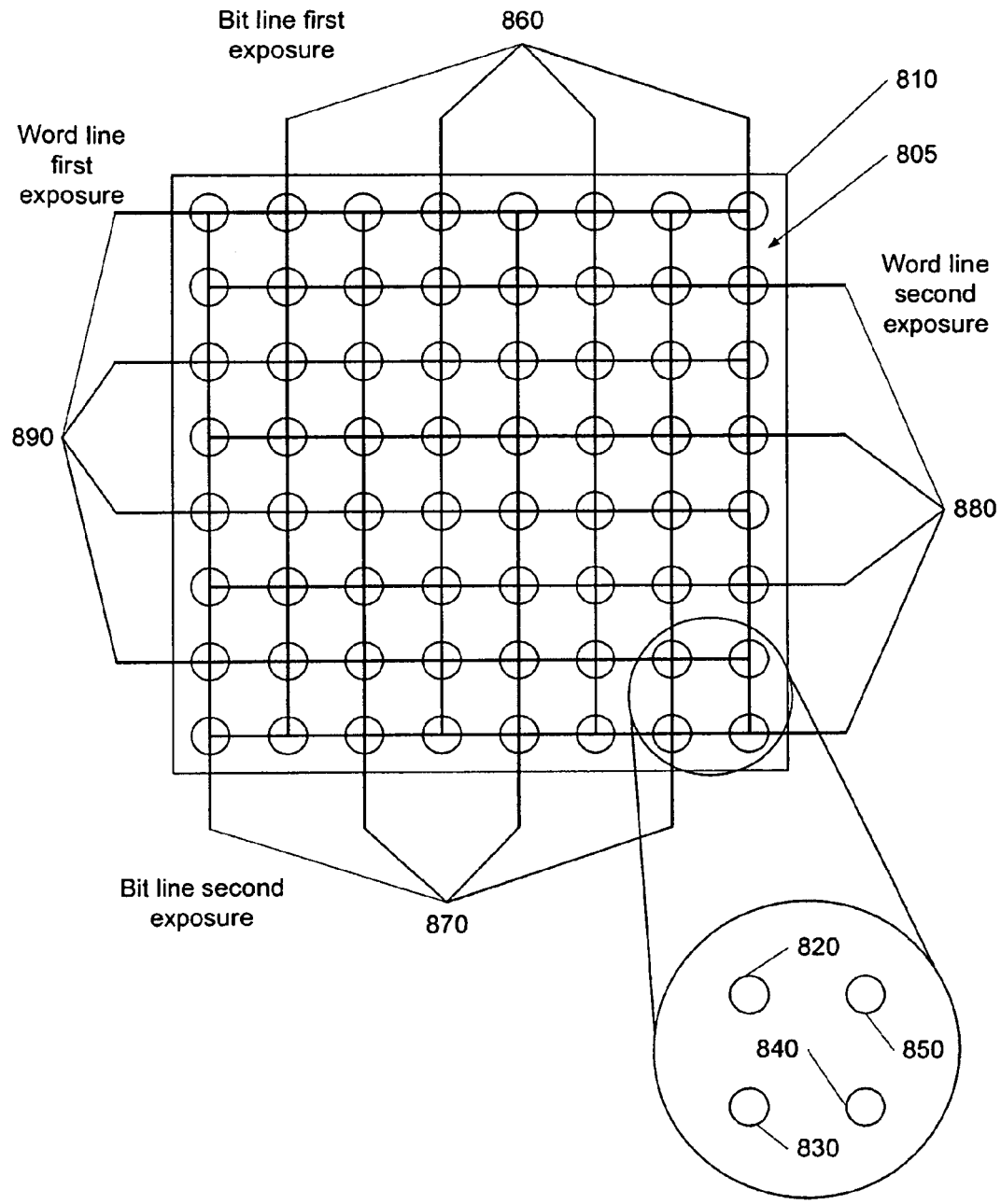
FIG. 8 is a diagram showing a quadruple exposure process of a memory cell array in accordance with an exemplary embodiment.

Alternatively, in a second embodiment, the pillars are formed in a rectangular grid using four exposures. Referring now to FIG. 8, a diagram showing a quadruple exposure process of a memory cell array in accordance with an exemplary embodiment is shown. First a photoresist layer is formed over the surface of the pillar material, such as the semiconductor layers of the other embodiments described herein. The photoresist can be a negative photoresist or a positive photoresist. In a rectangular subarray area 810, a first exposure of an exemplary negative photoresist layer is performed using a first mask to form first exposed regions 820 in the photoresist layer. Next, a second exposure of the photoresist layer is performed using a second mask to form second exposed regions 830 in the photoresist layer. A third exposure of the photoresist layer is performed using a third mask to form third exposed regions 840 in the photoresist layer. Finally, a fourth exposure of the photoresist layer is performed using a fourth mask to form fourth 850 exposed regions in the photoresist layer, such that any set of adjacent first 820, second 830, third 840, and fourth exposed regions 850 form a substantially rectangular or square pattern. The first, second, third, and fourth exposure create a grid pattern 805 in the photoresist layer after development and patterning of the photoresist. The first, second, third, and fourth mask can instead be a shared mask where the exposure for the second, third, and fourth exposure are made after shifting the location of the mask in a lithography tool by the appropriate amount. The photoresist pattern is then used to form a plurality of pillar shaped devices arranged in a substantially grid pattern. After the photoresist is developed, the pillar layer is etched. Consequently, the word lines and bit lines are aligned in a grid (i.e. crossing at about 90 degrees apart).

The bit line layer and word line layer (on either side of the pillar layer) are formed using double exposure. During word line formation, the photoresist on top of the word layer material is exposed using a first mask to image a first set of word lines 890. The photoresist is exposed again using a second mask to image a second set of word lines 880 which are adjacent to the first set of word lines 890. Likewise, during bit line formation, the photoresist on top of the bit layer material is exposed using a third mask to image a first set of bit lines 860. The photoresist is exposed again using a fourth mask to image a second set of bit lines 870 which are adjacent to the first set of bit lines 860.

Advantageously, quadruple exposure allows devices with smaller half-pitches to be formed which allows full use of the reduced scaling factor of double exposed lines. Additionally, devices with smaller half-pitches use smaller die sizes.

Hexagonal Memory Subarray Structure

Figure 1:
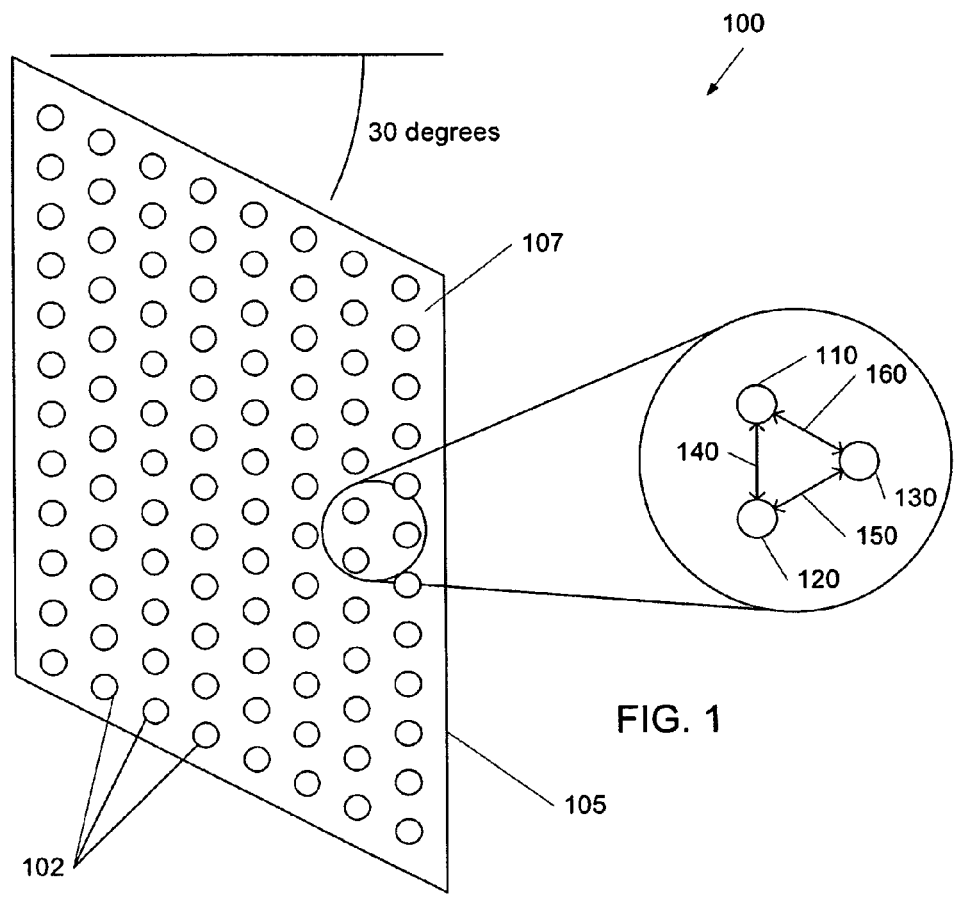
FIG. 1 is a top view of a memory cell subarray in accordance with an exemplary embodiment.

Referring to FIG. 1, a top view of a memory cell subarray 100 in accordance with a third embodiment is shown. The subarray 100 is a non-limiting example of a subarray that can be formed using the triple exposure method described in the first embodiment. The memory cell subarray 100 is part of a larger memory array (not depicted) which can be formed on a single die. A subarray boundary 105 of the memory cell subarray 100 is substantially parallelogram shaped. In other words, the subarray 100 has a four sided shape with at least two parallel sides (and preferably with two sets of parallel sides) having a one non-square corner. The term "substantially" parallelogram shaped includes small deviations from the parallelogram shape, such as non-straight boundary lines and/or small protrusions or recesses in the boundary. Preferably, the angle between two adjacent sides at the non-square corner is 20 to 80. In an exemplary embodiment, the parallelogram has one set of opposite angles that are approximately about 60 degrees each.

The memory cell subarray 100 is filled with memory cells 102. The memory cells 102 are preferably nonvolatile memory cells each comprising a pillar shaped current steering element and a resistivity switching element arranged in series. However, other types of volatile or nonvolatile memory cells may also be used. The cells are surrounded by a dielectric material 107. The dielectric material 107 is an insulator, for example, silicon dioxide. Other insulating materials, such as silicon nitride, etc., may also be used. The pillar shaped current steering element is preferably a diode. For example, a substantially cylindrical shaped diode of the type described in U.S. Pat. No. 6,951,780, incorporated herein by reference in its entirety. Other diode shapes, such as rectangular diodes, and other steering elements, such as transistors, may also be used. The cells may be one-time programmable (OTP) or re-writable cells of various types. Examples of the resistivity switching element in the cell includes antifuse, fuse, polysilicon memory effect cell, metal oxide memory, switchable complex metal oxide, graphene layers, carbon nanotube memory, phase change material memory, conductive bridge element, or switchable polymer memory. In an alternative configuration, the diode itself may comprise both the steering and the resistivity switching elements. In this case, the cell may include only the diode or the diode in combination with a second resistivity switching element, such as the antifuse.

The memory cells 102 are typically in a pillar configuration disposed between a top and bottom conductor. The general shape of the pillars is typically cylindrical though the pillar can have non-circular cross sectional shapes, such as oval, rectangular or other polygonal shapes. For example, the pillars may comprise an elliptic cylinder, an oblique cylinder, a generalized cylinder, a prism, or a hexagonal prism. The geometric description of the general shape of a memory cell is not limiting; persons of skill in the art will recognize that a memory cell is not restricted to any specific shape or construction.

The memory cells 102 are arranged in a substantially hexagonal pattern which is contained by the subarray boundary 105. A hexagonal pattern has three axes of symmetry, in the same plane, about a point the array. The three axes are separated by substantially 60 degrees from one another. Hence, the memory cells 102 are arranged on a hexagonal grid which is also known as hexagonal tiling, bitruncated hexagonal tiling, or omnitruncated hexagonal tiling.

Figure 2:
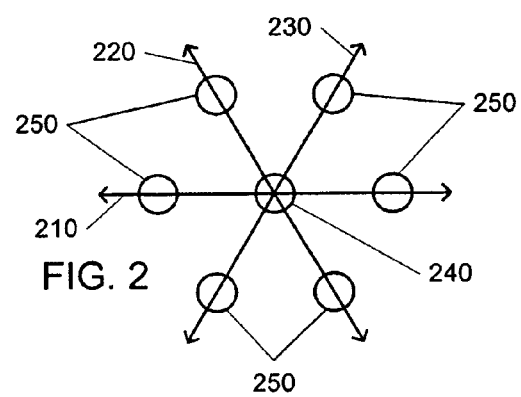
FIG. 2 is a diagram of a hexagonal pattern.

FIG. 2 shows a diagram of a hexagonal pattern. The hexagonal pattern consists of a repeating pattern of seven nonvolatile memory cells having a central nonvolatile memory cell 240 surrounded by six other nonvolatile memory cells 250 arranged in a hexagonal layout around the central nonvolatile memory cell 240. The hexagonal pattern has three axes of symmetry: a first axis 210, a second axis 220, and a third axis 230. The first axis 210, the second axis 220, and the third axis 230 are separated by substantially 60 degrees from one another.

Referring again to FIG. 1, the detail view of the memory cell subarray is described. The detail view shows a first memory cell 110, a second memory cell 120, and a third memory cell 130. The first memory cell 110 and the second memory cell 120 are separated by a first distance 140. The second memory cell 120 and the third memory cell 130 are separated by a second distance 150. The first memory cell 110 and the third memory cell 130 are separated by a third distance 160. The first distance 140, the second distance 150, and the third distance 160 are about equal. Thus, any three adjacent memory cells are equidistant from each other and are located in a same plane. The half pitch between the first memory cell 110 and the second memory cell 120, the second memory cell 120 and the third memory cell 130, and the first memory cell 110 and the third memory cell 130 is about 22 nm. However, the half-pitch is not restricted to 22 nm and may range from about 5 nm to about 65 nm for example (e.g. 10 nm, 32 nm or 45 nm). Advantageously, hexagonal packing of the memory cells takes only about 87% of the area typically used by the same number of cells using standard rectangular memory layout.

Figure 3:
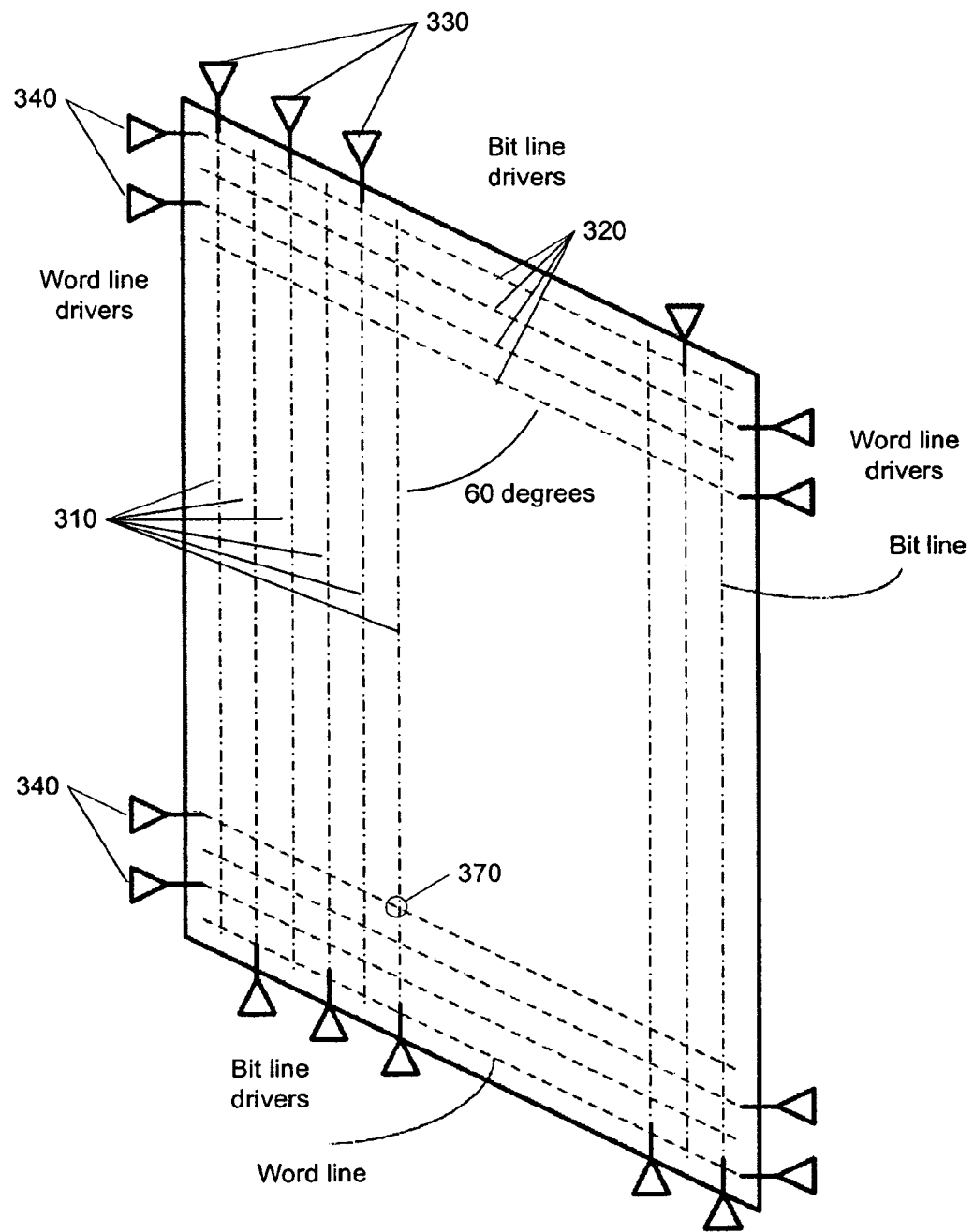
FIG. 3 is a top view of the bit line and word line layout of the memory cell subarray of FIG. 1 in accordance with an exemplary embodiment.

Referring now to FIG. 3, a top view of the bit line and word line layout of the memory cell subarray of FIG. 1 in accordance with an exemplary embodiment is shown. Memory cells are each associated with a bit line 310 and a word line 320. The bit line(s) 310 are driven by one or more bit line drivers 330. The word line(s) 320 are driven by a one or more word line driver(s) 340.

The traces of the bit line 310 and the word line 320 follow the hexagonal pattern/grid described above. Hence the word line 320 is about 60 degrees off of the bit line 310 when viewed from the top perspective. Thus, the word line(s) cross the bit line(s) at an angle of about 60 degrees. An exemplary memory cell 370 is depicted on the intersection of a bit line and a word line, where the pillar shaped cell extends into the page of the drawing. It should be noted that the bit line(s) 310 and the word line(s) 320 are usually on different layers of the memory device. Additionally, the bit line(s) 310 and/or the word line(s) 320 can be shared between different layers or levels of memory cells in a three dimensional array of memory cells. It should also be noted that the half-pitch of the bit lines and the word lines is about 0.87 times the half pitch of the memory cells.

Figure 4A:
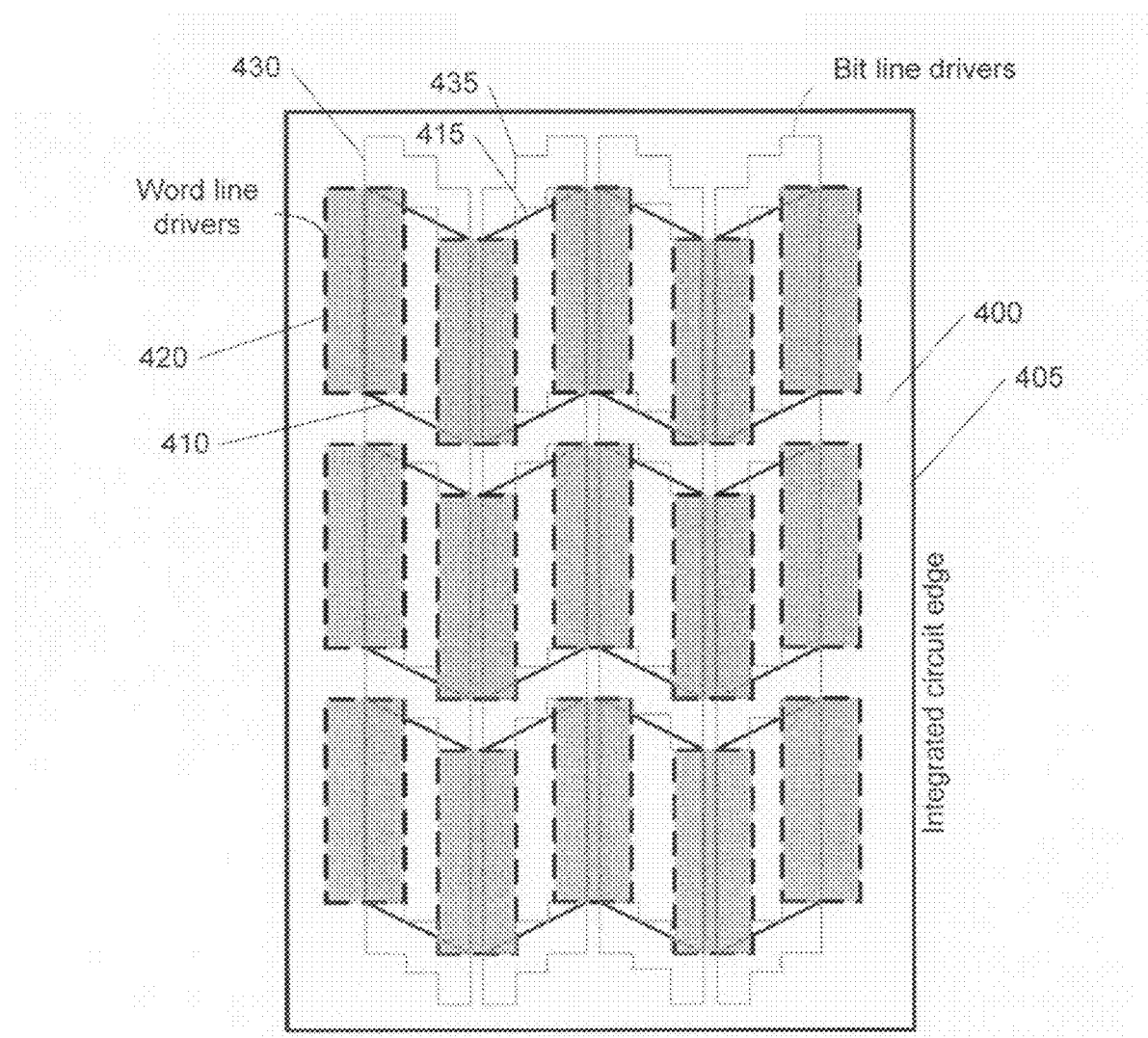
FIGS. 4A, 4B, 4C and 4D are top views of an array of memory subarrays in accordance with an exemplary embodiment.
Figure 4B:
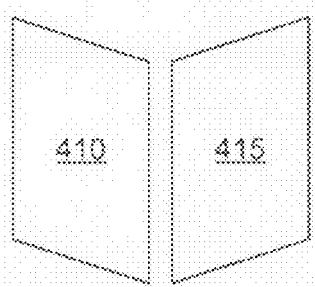

Referring now to FIG. 4A, a top view of an array of memory subarrays in accordance with an exemplary embodiment is shown. A plurality of subarrays, such as four or more subarrays, can be constructed over a substrate, such as a die 400. The substrate may comprise a semiconductor substrate, such as a silicon or compound semiconductor substrate, or a non-semiconductor substrate, such as a glass, ceramic, plastic, metal, etc., substrate. The die 400 has an integrated circuit edge 405. In order to optimize layout, two types of subarray are used—a first subarray 410 and a second subarray 415. An example of the first subarray 410 and the second subarray 415 layout are shown in FIG. 4B. The first subarray 410 is shaped like a parallelogram with one set of 60 degree opposite angles. The second subarray 415 is shaped like a parallelogram with one set of 60 degree opposite angles; however, the layout of the second subarray 415 is the mirror of the first subarray 410. Hence, two of the sides (i.e., the vertical sides in FIG. 4B) of the first subarray 410 and two of the sides of the second subarray 415 are parallel with each other. The non-parallel sides (i.e., diagonal sides) of one subarray extend about 120 degrees apart from the respective sides of the other subarray. Thus, adjacent subarrays form a substantial mirror image of each other about a mirror plane extending parallel to the parallel sides (i.e., vertical sides in FIG. 4B) of the adjacent subarrays.

The first subarray 410 and the second subarray 415 are each composed of a level of a plurality of nonvolatile memory cells and an associated plurality of bit lines and word lines that connect to the memory cells. The bit lines of the first subarray 410 and the bit lines of the second subarray 415 are parallel. The word lines of the first subarray 410 and the word lines of the second subarray 415 extend in respective directions which are about 120 degrees apart. It should be noted that the word lines and bit lines may be reversed, such that the word lines of adjacent arrays are parallel and the bit lines of the adjacent arrays extend in directions which are about 120 degrees apart.

Figure 4C:
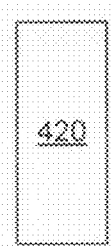

The word lines of the first subarray 410 and the word lines of the second subarray 415 are driven by a plurality of word line driver circuits 420. An example of the plurality of word line driver circuits 420 layout is shown in FIG. 4C. The plurality of word line driver circuits 420 are word line drivers matched to the type of memory cell. For example, the word line drivers can be of the voltage forcing type. Additionally, the word line drivers can have dual use devices as described in more detail in U.S. Pat. No. 6,856,572, which hereby incorporated by reference in its entirety. The plurality of word line driver circuits 420 can be shared amongst subarrays and amongst memory cell levels within a subarray. In one embodiment half the word lines are driven from the left side of the subarray and the other half are driven from the right side of the subarray.

Figure 4D:
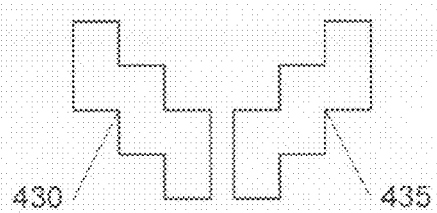

The bit lines of the first subarray 410 and the bit lines of the second subarray 415 are driven by a first plurality of bit line driver circuits 430 and a second plurality of bit line driver circuits 435. An example of the first plurality of bit line driver circuits 430 and the second plurality of bit line driver circuits 435 layout is shown in FIG. 4D. The first plurality of bit line driver circuits 430 is staggered to match the non-parallel edge of the first subarray 410. The second plurality of bit line driver circuits 435 is staggered to match the non-parallel edge of the second subarray 415. Staggering means that the layout of the circuit looks like a staircase; that is, the circuit is chunked into blocks to follow a skewed path, such as a diagonal edge of a subarray which extends at an angle of about 60 degrees from the adjacent edge of the same subarray. The bit line driver circuits are staggered in order to transition from the skew edge of the memory subarrays to the integrated circuit edge 405. The first plurality of bit line driver circuits 430 and the second plurality of bit line driver circuits 435 are bit line drivers matched to the type of memory cell. For example, the bit line drivers can be of the current sensing type. Additionally, the bit line drivers can have separate read and write lines or be bidirectional. The first plurality of bit line driver circuits 430 and the second plurality of bit line driver circuits 435 can be shared amongst subarrays and amongst memory cell levels within a subarray.

A plurality of the first subarrays 410 and the second subarrays 415 are constructed over the substrate, such as the die 400 in a substantially rectangular array so that outline of the rectangular array follows the integrated circuit edge 405. The plurality of word line driver circuits 420 are preferably located on a different level from the subarrays of the nonvolatile memory cells, such as below the subarrays, for example in or on a surface of substrate such as a silicon wafer. Each the word line driver circuit 420 preferably occupies an area that straddles a projection of the parallel (i.e., vertical) sides respective subarrays. Preferably, the central portions of the word line driver circuits are exposed in the space between adjacent overlying memory subarrays, while edge portions of the word line driver circuits are located directly below the overlying memory subarrays, as shown in FIG. 4A. However, other suitable layout configurations may also be used. The plurality of word line driver circuits 420 are connected to the word lines of the subarrays by vertical word line connectors. The vertical word line connectors are also known as conductor filled vias or zias. The zias allow multiple levels of subarrays to be connected to the same plurality of word line driver circuits. The word zias can also be shared amongst subarrays.

The bit line driver circuits are also located on a different level from the subarrays of nonvolatile memory cells, such as below the subarrays, for example in or on a surface of substrate such as a silicon wafer. Each the bit line driver circuit occupies a staggered area that preferably straddles a projection of the diagonal sides over the overlying subarrays. First plurality bit line driver circuits 430 are located below respective first subarrays 410 while a second plurality of bit line driver circuits 435 are located below the second subarrays 415. Preferably, the central portions of the bit line driver circuits 430, 435 are exposed in the space between adjacent overlying memory subarrays 410, 415, respectively, while edge portions of the bit line driver circuits are located directly below the overlying memory subarrays, as shown in FIG. 4A. However, other suitable layout configurations may also be used. The first plurality of bit line driver circuits 430 and the second plurality of bit line driver circuits 435 are connected to the bit lines of the subarrays by vertical word line connectors, such as zias. The zias allow multiple levels of subarrays to be connected to the same plurality of bit line driver circuits. The bit zias can also be shared amongst subarrays. The drivers are preferably located on all four sides of each subarray, with a substantially equal number of drivers on opposite sides of each subarray.

Figure 5:
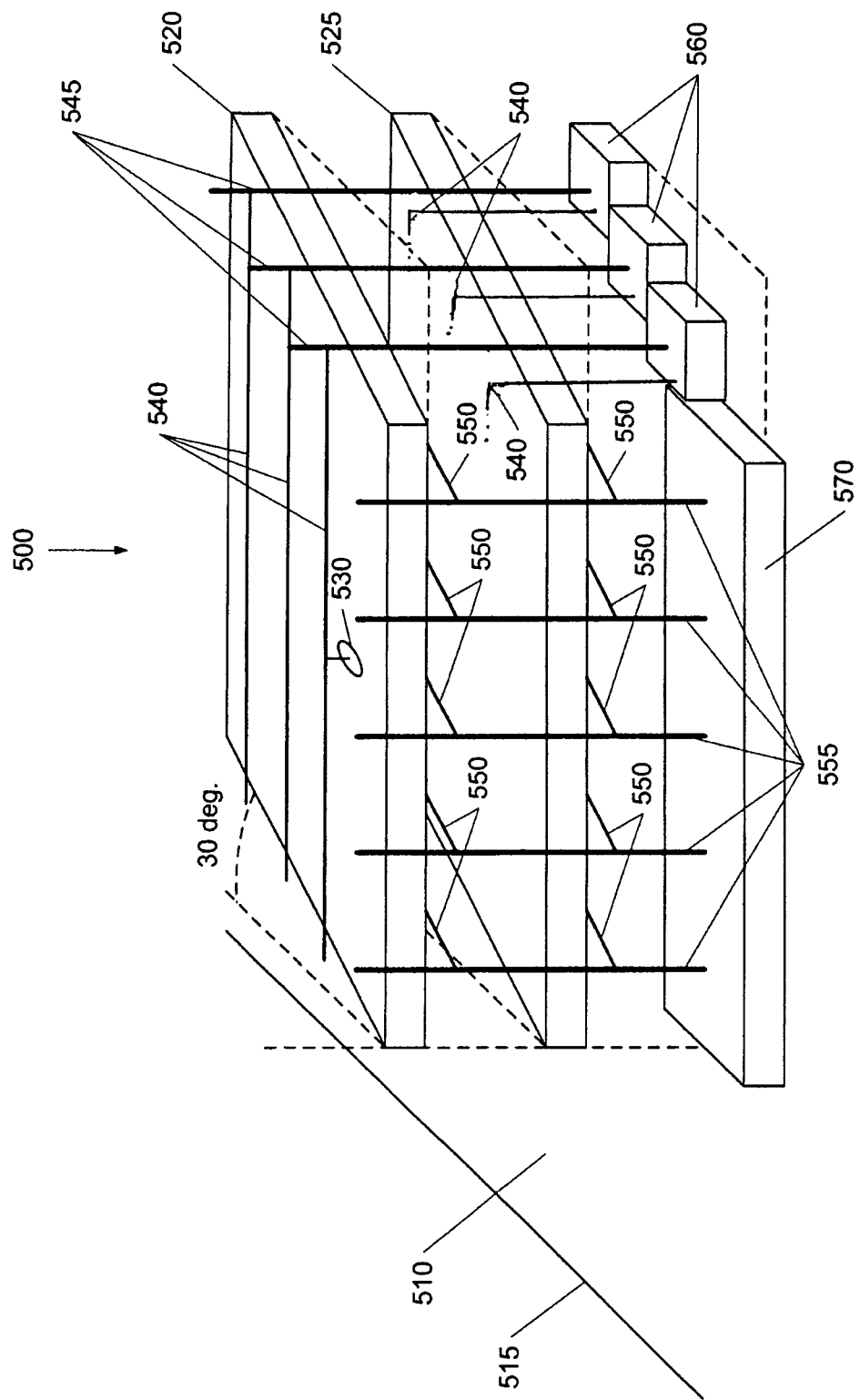
FIG. 5 is a perspective view of a memory subarray in accordance with an exemplary embodiment.

Referring now to FIG. 5, a perspective view of a memory subarray in accordance with an exemplary embodiment is shown to illustrate the three dimensional aspects of an array of memory subarrays. A three dimensional array of subarrays 500 is depicted on a die 510. The three dimensional array of subarrays 500 has a first memory subarray 520 in a first level and a second memory subarray 525 in a second level. The first memory subarray 520 is located directly above the second memory subarray 525. The first memory subarray level 520 is shaped substantially like a parallelogram. The first memory subarray 520 has two opposing sides that extend about perpendicular relative to a die edge 515. The other two sides of the first memory subarray 520 extend non-parallel, such as at an angle of about 30 degrees relative to the die edge 515. The second memory subarray 525 is shaped similar to the first memory subarray 520.

The first memory subarray 520 and the second memory subarray 525 both contain a plurality of memory cells organized in a hexagonal pattern. An exemplary memory cell 530 is shown. The memory cells of the first memory subarray 520 and the second memory subarray 525 are associated with bit lines 540 and word lines 550. The bit lines 540 and word lines 550 connect to the individual memory cells. It should be noted that instead of the configuration shown in FIG. 5, the bit lines may be located below each subarray and the word lines may be located above each subarray if desired. The word lines extend substantially parallel to diagonal sides of each subarray and the bit lines extend substantially parallel to the other sides of each subarray. The bit lines 540 are connected to vertical bit line connections 545, such as bit line zias. In a preferred embodiment, bit lines from subarray 520 have separate bit line zias from the bit line zias connected to bit lines on sub array 525. FIG. 5 shows separate bit line zias connected to bit lines 540 in subarrays 520 and 525. In this case, each block (i.e., stepped portion) 560 shown in FIG. 5 comprises at least two bit line drivers. However, each bit line driver may be located in a separate block. Preferably, in a vertical group of subarrays that share word line zias 555 between word lines 550, the bit lines 540 do not share zias 545 to uniquely address cells. However, bit lines 540 from adjacent subarrays on the same level can still share bit line zias 545. As noted above, the word lines 550 are connected to vertical word line connections 555, such as word line zias. In a preferred embodiment, the word line zias are shared, as described, for example in U.S. Pat. No. 7,177,169 which is incorporated herein by reference in its entirety. These word line zias extend along side the first memory subarray 520 and the second memory subarray 525 and in the space between adjacent subarrays in the same level. The bit line zias extend between the diagonal sides of adjacent subarrays and the word line zias extend between the other sides of the adjacent subarrays. As noted above, the word lines and the bit lines may be reversed and thus the word line and bit line zia designations may be reversed as well if desired.

The vertical bit line connections 545 are driven by a bit line driver 560. The vertical word line connections 555 are driven by a word line driver 570. The bit line driver 560 and the word line driver 570 can be located at least partially underneath the first memory subarray 520 and the second memory subarray 525, as described in more detail above with respect to FIG. 4A. Alternatively, only the word line drivers may be located underneath the first memory subarray and the bit line drivers are not located underneath the first memory subarray.

Advantageously, by placing the bit line driver circuits and the word line driver circuits on a different level than the memory subarrays, the memory subarrays can be packed together more tightly thereby reducing the die space needed for a memory device. Additionally, by transitioning the skewed, non-parallel edge of a memory subarray to be parallel with the integrated circuit edge, outside devices can more easily interface with the die.

Triple exposure or quadruple exposure are not restricted to memory devices or semiconductor devices in general. For example, the above described methods can be used to create light emitting devices in liquid crystal displays, magnetic storage elements on a hard disk drive, or any other device that is formed as a pillar-like shape. Hence, the substrates used could also be glass, metal, ceramics or plastics. The term substrate may also include thin film materials formed on top of other substrates.

While the invention has been largely described with respect to the embodiments set forth above, the invention is not necessarily limited to these embodiments. For example, the instant invention can also be applied to three-dimensional memory arrays configured as a plurality of levels, where word lines and/or bit lines are shared between levels, such as segmented word line arrays, including, but not limited to: (1) the memory described in U.S. Pat. No. 6,034,882 issued on Mar. 7, 2000 and U.S. Pat. No. 6,185,122 issued on Feb. 6, 2001, to Mark G. Johnson, et al., both commonly assigned herewith; (2) the memory array described in U.S. patent application Ser. No. 09/560,626 filed on Apr. 28, 2000, in the name of N. Johan Knall and commonly assigned herewith; (3) the memory array described in U.S. patent application Ser. No. 09/814,727 filed on Mar. 21, 2001, in the name of N. Johan Knall and Mark G. Johnson and commonly assigned herewith; The memory described in "Three-Dimensional Memory Array Incorporating Serial Chain Diode Stack" by Kleveland, et al, U.S. patent application Ser. No. 09/897,705, filed on Jun. 29, 2001; the memory described in U.S. Pat. No. 7,177,169 referenced above; and the memory described in U.S. patent application Ser. No. 10/185,508 by Cleeves, filed Jun. 27, 2002, entitled "Three Dimensional Memory", each of which is hereby incorporated by reference.

As used herein, a passive element memory array includes a plurality of 2-terminal memory cells, each connected between an associated X-line and an associated Y-line. Such a memory array may be a two-dimensional (planar) array or may be a three-dimensional array having more than one plane of memory cells. Each such memory cell has a non-linear conductivity in which the current in a reverse direction (i.e., from cathode to anode) is lower than the current in a forward direction. Application of a voltage from anode to cathode greater than a programming level changes the conductivity of the memory cell. The conductivity may decrease when the memory cell incorporates a fuse technology, or may increase when the memory cell incorporates an antifuse technology. A passive element memory array is not necessarily a one-time programmable (i.e., write once) memory array. The memory cell may incorporate a reprogrammable memory material for which the conductivity may decrease or increase after application of a suitable electrical pulse.

Such passive element memory cells may generally be viewed as having a current steering element such as a diode directing current in a direction and another component which is capable of changing its state (e.g., a fuse, an antifuse, a capacitor, a resistive element, etc.). In alternative configurations, the memory element is a diode-like structure having a p+ region separated from an n– region by an antifuse element. When the antifuse element is programmed, the p+ region is electrically connected to the n– region and forms a diode. The programming state of the memory element can be read by sensing current flow or voltage drop when the memory element is selected. In an organic PEMA embodiment, the memory element is a diode-like structure having an anode region separated from a cathode region by an organic material layer whose conductivity changes as electrons are injected into the layer.

Preferably, the memory cells are comprised of semiconductor materials, as described in U.S. Pat. No. 6,034,882 to Johnson et al., U.S. Pat. No. 5,835,396 to Zhang, U.S. patent application Ser. No. 09/560,626 by Knall, and U.S. patent application Ser. No. 09/638,428 by Johnson, each of which are hereby incorporated by reference. Specifically an antifuse memory cell may be used. Other types of memory arrays that are stackable over support circuits, such as MRAM and organic passive element arrays, can also be used. MRAM (magnetoresistive random access memory) is based on magnetic memory elements, such as a magnetic tunnel junction (MTJ). MRAM technology is described in "A 2556 kb 3.0V ITIMTJ Nonvolatile Magnetoresistive RAM" by Peter K. Naji et al., published in the Digest of Technical Papers of the 2001 IEEE International Solid-State Circuits Conference, ISSCC 2001/Session 7/Technology Directions: Advanced Technologies/7.6, Feb. 6, 2001 and pages 94-95, 404-405 of ISSCC 2001 Visual Supplement, both of which are hereby incorporated by reference. Certain passive element memory cells incorporate layers of organic materials including at least one layer that has a diode-like characteristic conduction and at least one organic material that changes conductivity with the application of an electric field. U.S. Pat. No. 6,055,180 to Gudensen et al. describes organic passive element arrays and is also hereby incorporated by reference. Memory cells comprising materials such as phase-change materials and amorphous solids can also be used. See U.S. Pat. No. 5,751,012 to Wolstenholme et al. and U.S. Pat. No. 4,646,266 to Ovshinsky et al., both of which are hereby incorporated by reference. Memory cells comprising resistance change materials including transition metal oxides, as described in more detail in U.S. patent application Ser. No. 11/287,452 by Herner, et al. which is hereby incorporated by reference, and carbon nanotube layers, which may be formed as described in U.S. Patent Pub 20050269553 by Sen, Rahul; et al. which is hereby incorporated by reference, or a switchable resistance material comprising several atomic layers of graphene can also be used.

Based upon the teachings of this disclosure, it is expected that one of ordinary skill in the art will be readily able to practice the present invention. The descriptions of the various embodiments provided herein are believed to provide ample insight and details of the present invention to enable one of ordinary skill to practice the invention. Although certain supporting circuits (e.g., decoders, sensing circuits, multiplexers, input/output buffers, etc.) are not specifically described, such circuits are well known, and no particular advantage is afforded by specific variations of such circuits in the context of practicing this invention. Moreover, it is believed that one of ordinary skill in the art, equipped with the teaching of this disclosure, will be able to carry out the invention, including implementing various control circuits inferred but not specifically described herein, using well known circuit techniques and without undue experimentation. Nonetheless, additional details of bias conditions, bias circuits, and layer decoder circuits particularly suitable for a three-dimensional memory array of write-once anti-fuse passive element memory cells are described in U.S. application Ser. No. 09/897,771, entitled "Method and Apparatus for Biasing Selected and Unselected Array Lines When Writing a Memory Array", by Roy E. Scheuerlein, filed on Jun. 29, 2001, and in "Three-Dimensional Memory Array Incorporating Serial Chain Diode Stack" by Kleveland, et al, U.S. patent application Ser. No. 09/897,705, filed on Jun. 29, 2001 referred to above, which are both hereby incorporated by reference in their entirety.

In the above description, an array line is generally shared by two levels of the memory array (i.e., memory planes). Alternatively, a memory array may be fabricated having two conductors for each plane that are not shared with other planes. A dielectric layer may be used to separate each such memory level.

Word lines may also be referred to as row lines or X-lines, and bit lines may also be referred to as column lines or Y-lines. The distinction between "word" lines and "bit" lines may carry certain connotations to those skilled in the art. When reading a memory array, it is assumed by some practitioners that word lines are "driven" and bit lines are "sensed." Moreover, the memory organization (e.g., data bus width, number of bits simultaneously read during an operation, etc.) may have some association with viewing one set of the two array lines more aligned with data "bits" rather than data "words." Neither connotation is necessarily intended in this description.

The directionality of X-lines (e.g., which may be shown horizontally) and Y-lines (e.g., which may be shown vertically) is merely convenient for ease of description of the two groups of crossing lines in the array. While X-lines are usually orthogonal to Y-lines, such is not necessarily implied by such terminology. Moreover, the word and bit organization of a memory array may also be easily reversed, having Y-lines organized as word lines and X-lines organized as bit lines. As an additional example, portions of an array may correspond to different output bits of given word. Such various array organizations and configurations are well known in the art, and the invention in intended to comprehend a wide variety of such variations.

The embodiments described may refer to a selected word line being driven to a voltage and a selected bit line being sensed in a read mode, and memory cell anode terminals connected to word lines and cathode terminals connected to bit lines, but other embodiments are specifically contemplated. For example, in a three-dimensional (i.e., multi-level) memory array, an adjacent memory plane may be connected similarly (e.g., a back-to-back diode stack memory array as described in U.S. Pat. No. 6,034,882 to Johnson, et al., referred to above), or may reverse the directionality of memory cells in the adjacent plane (e.g., a serial chain diode stack memory array as described in U.S. patent application Ser. No. 09/897,705 by Kleveland, et al., referred to above) so that the anode terminals are connected to bit lines and the cathode terminals to word lines. Consequently, the designations herein of X-lines, word lines, and row lines, and of Y-lines, bit lines, and column lines are illustrative of the various embodiments but should not be viewed in a restrictive sense, but rather a more general sense. For example, sensing circuits may be coupled to word lines rather than bit lines, or may be used for both word lines and bit lines, when sensing a current in a word line rather than in a bit line. For example, it should be appreciated that the designations X-line and Y-line for various array lines of a memory array on a serial chain diode stack do not necessarily imply which terminal of the memory cells (i.e., anode or cathode) is coupled to the particular line, as with a back-to-back diode stack. An X-line may be coupled to the anode terminal of memory cells in one associated memory plane, and may be coupled to the cathode terminal of memory cells in an adjacent memory plane.

Integrated circuits incorporating a memory array usually subdivide the array into a sometimes large number of smaller arrays, also sometimes known as subarrays. As used herein, an array is a contiguous group of memory cells having contiguous word and bit lines generally unbroken by decoders, drivers, sense amplifiers, and input/output circuits. An integrated circuit including a memory array may have one array, more than one array, or even a large number of arrays. An used herein, an integrated circuit memory array is a monolithic integrated circuit structure, rather than more than one integrated circuit device packaged together or in close proximity, or die-bonded together.

The foregoing details description has described only a few of the many possible implementations of the present invention. For this reason, this detailed description is intended by way of illustration, and not by way of limitations. Variations and modifications of the embodiments disclosed herein may be made based on the description set forth herein, without departing from the scope and spirit of the invention. It is only the following claims, including all equivalents, that are intended to define the scope of this invention.

What is claimed is:

1. A method of making a device, comprising:
   forming a photoresist layer over a substrate;
   performing a first exposure of the photoresist layer using a first mask to form first exposed regions in the photoresist layer;
   performing a second exposure of the photoresist layer using a second mask to form second exposed regions in the photoresist layer;
   performing a third exposure of the photoresist layer using a third mask to form third exposed regions in the photoresist layer, such that each adjacent first, second and third exposed regions are approximately equidistant from each other;
   patterning the photoresist layer after the first, the second and the third exposures;
   etching the substrate using the patterned photoresist layer;
   forming a plurality of pillar shaped devices arranged in a substantially hexagonal pattern, wherein the substantially hexagonal pattern comprises a repeating pattern of seven nonvolatile memory cells having a central nonvolatile memory cell surrounded by six other nonvolatile memory cells arranged in a hexagonal layout around the central nonvolatile memory cell;
   forming a plurality of bit lines using double photoresist exposure; and
   and forming a plurality of word lines using double photoresist exposure.

2. The method of claim 1, wherein the step of etching the substrate comprises etching a hard mask layer located below the photoresist layer followed by etching at least one semiconductor layer located below the hard mask layer to form the pillar shaped nonvolatile memory cells.

3. The method of claim 1, wherein the photoresist layer is a negative photoresist.

4. The method of claim 1, wherein the photoresist layer is a positive photoresist.

5. The method of claim 4, wherein:
   the step of patterning the photoresist layer after the first, the second and the third exposures comprises forming holes in the positive photoresist layer; and
   the step of etching the substrate using the patterned photoresist layer comprises forming a hard mask layer in the holes in the positive photoresist layer, removing the photoresist layer, and etching at least one semiconductor layer located below the hard mask layer to form the pillar shaped nonvolatile memory cells.

6. The method of claim 1, wherein the plurality of bit lines and the plurality of word lines are located in two different planes, and the plurality of word lines cross the plurality of bit lines at an angle of about 60 degrees.

7. The method of claim 1, wherein each nonvolatile memory cell comprises a one time programmable or a rewritable cell selected from at least one of antifuse, fuse, diode and antifuse arranged in a series, polysilicon memory effect cell, metal oxide memory, switchable complex metal oxide, carbon nanotube memory, graphene switchable resistance material, phase change material memory, conductive bridge element, or switchable polymer memory.

8. The method of claim 1, wherein at least two of the first, the second and the third masks comprise a same mask.

9. The method of claim 1, wherein the plurality of pillar shaped devices comprise magnetic storage material.

10. A method of making a device, comprising:
    forming at least one semiconductor layer over first conductor lines;
    forming a first photoresist layer over the at least one semiconductor layer;
    performing a first exposure of the first photoresist layer using a first mask to form first exposed regions in the first photoresist layer;
    performing a second exposure of the first photoresist layer using a second mask to form second exposed regions in the first photoresist layer;
    performing a third exposure of the first photoresist layer using a third mask to form third exposed regions in the first photoresist layer;
    performing a fourth exposure of the first photoresist layer using a fourth mask to form fourth exposed regions in the first photoresist layer;
    patterning the first photoresist layer after the first, the second, the third and the fourth exposures;
    etching the at least one semiconductor layer to form a plurality of pillar shaped devices; and
    forming a plurality of second conductor lines over the plurality of pillar shaped devices,
    wherein the first conductor lines comprise word lines, the second conductor lines comprise bit lines, and the pillar shaped devices comprise nonvolatile memory cells arranged in a square or rectangular pattern.

11. A method of making a device, comprising:
    forming a first photoresist layer over at least one first conductive layer located over a substrate;
    performing a first exposure of the first photoresist layer using a first mask to form first exposed regions in the first photoresist layer;
    performing a second exposure of the first photoresist layer using a second mask to form second exposed regions in the first photoresist layer;
    patterning the first photoresist layer after the first and the second exposures;
    etching the at least one first conductive layer using the patterned first photoresist layer as a mask to form a plurality of first conductor lines;

forming at least one semiconductor layer over the plurality of first conductor lines;

forming a second photoresist layer over the at least one semiconductor layer;

performing a third exposure of the second photoresist layer using a third mask to form third exposed regions in the second photoresist layer;

performing a fourth exposure of the second photoresist layer using a fourth mask to form fourth exposed regions in the second photoresist layer;

performing a fifth exposure of the second photoresist layer using a fifth mask to form fifth exposed regions in the second photoresist layer;

performing a sixth exposure of the second photoresist layer using a sixth mask to form sixth exposed regions in the second photoresist layer;

patterning the second photoresist layer after the third, the fourth, the fifth and the sixth exposures;

etching the at least one semiconductor layer to form a plurality of pillar shaped devices; and forming a plurality of second conductor lines over the plurality of pillar shaped devices.

12. A method of making a device, comprising:

forming at least one semiconductor layer over first conductor lines formed from at least one first conductive layer;

forming a first photoresist layer over the at least one semiconductor layer;

performing a first exposure of the first photoresist layer using a first mask to form first exposed regions in the first photoresist layer;

performing a second exposure of the first photoresist layer using a second mask to form second exposed regions in the first photoresist layer;

performing a third exposure of the first photoresist layer using a third mask to form third exposed regions in the first photoresist layer;

performing a fourth exposure of the first photoresist layer using a fourth mask to form fourth exposed regions in the first photoresist layer;

patterning the first photoresist layer after the first, the second, the third and the fourth exposures;

etching the at least one semiconductor layer to form a plurality of pillar shaped devices;

forming at least one second conductive layer over the pillar shaped devices;

forming a second photoresist layer over the at least one second conductive layer;

performing a fifth exposure of the second photoresist layer using a fifth mask to form fifth exposed regions in the second photoresist layer;

performing a sixth exposure of the second photoresist layer using a sixth mask to form sixth exposed regions in the second photoresist layer;

patterning the second photoresist layer after the fifth and the sixth exposures; and etching the at least one second conductive layer using the patterned second photoresist layer as a mask to form a plurality of second conductor lines.

13. The method of claim 12, wherein the first conductor lines comprise word lines, the second conductor lines comprise bit lines, and the pillar shaped devices comprise nonvolatile memory cells arranged in a square or a rectangular pattern.

14. The method of claim 12, further comprising:

forming a third photoresist layer over the at least one first conductive layer located over a substrate;

performing a seventh exposure of the third photoresist layer using a seventh mask to form seventh exposed regions in the third photoresist layer;

performing a eighth exposure of the third photoresist layer using a eighth mask to form eighth exposed regions in the third photoresist layer;

patterning the third photoresist layer after the seventh and the eighth exposures; and etching the at least one first conductive layer using the patterned third photoresist layer as a mask to form a plurality of the first conductor lines.

* * * * *